United States Patent [19]

Longeway

[11] Patent Number: 4,699,675
[45] Date of Patent: Oct. 13, 1987

[54] VAPOR PHASE GROWTH OF III-V MATERIALS

[75] Inventor: Paul A. Longeway, East Windsor, N.J.

[73] Assignee: RCA Corporation, Princeton, N.J.

[21] Appl. No.: 813,409

[22] Filed: Dec. 26, 1985

[51] Int. Cl.$^4$ .......................................... H01L 21/203
[52] U.S. Cl. ...................................... 437/81; 118/719; 427/38; 427/39; 427/309; 437/108
[58] Field of Search ................. 118/719; 427/87, 309, 427/38, 39, 86; 148/175

[56] References Cited

U.S. PATENT DOCUMENTS

| | | | |
|---|---|---|---|
| 3,312,570 | 4/1967 | Ruehrwein | 148/175 |
| 3,493,811 | 2/1970 | Ewing | 315/169 |
| 3,853,974 | 12/1974 | Revschel et al. | 264/81 |
| 3,893,876 | 7/1975 | Akai et al. | 148/175 |
| 3,978,253 | 8/1976 | Sahm | 427/309 |
| 4,022,928 | 5/1977 | Piwcyzk | 427/43 |
| 4,062,706 | 12/1977 | Ruehrwien | 148/175 |
| 4,116,733 | 9/1978 | Olsen et al. | 148/175 |
| 4,428,975 | 1/1984 | Dahm et al. | 427/94 |
| 4,430,149 | 2/1984 | Berkman | 156/613 |
| 4,522,849 | 6/1985 | Lewandowski | 427/237 |
| 4,579,609 | 4/1986 | Rief et al. | 29/576 B |

FOREIGN PATENT DOCUMENTS 54-140468 10/1979 Japan .

OTHER PUBLICATIONS

Olsen et al., Journal of Electronic Materials, vol. 9, No. 6, pp. 977–987, (1980).
Olsen in GaInAsP Alloy Semiconductors, T. P. Pearsall, Editor, John Wiley & Sons, (New York, 1982), pp. 11–41.

*Primary Examiner*—Brian E. Hearn
*Assistant Examiner*—Beverly A. Pawlikowski
*Attorney, Agent, or Firm*—Allen L. Limberg; Harley R. Ball

[57] ABSTRACT

The fabrication of a layer of a III-V semiconductor material by vapor phase epitaxy is improved by precoating the walls of the deposition chamber in a suitable apparatus with the desired material. The coating of the deposition chamber is continued until the material being deposited is depth-uniform and of the same composition as the desired layer. Material then deposited on the substrate is free of depth compositional gradient. In a further improvement, the walls of the deposition chamber of the apparatus are roughened, thus providing nucleation sites for the growing coating and substantially reducing the time required to precoat the walls of the deposition chamber.

4 Claims, 5 Drawing Figures

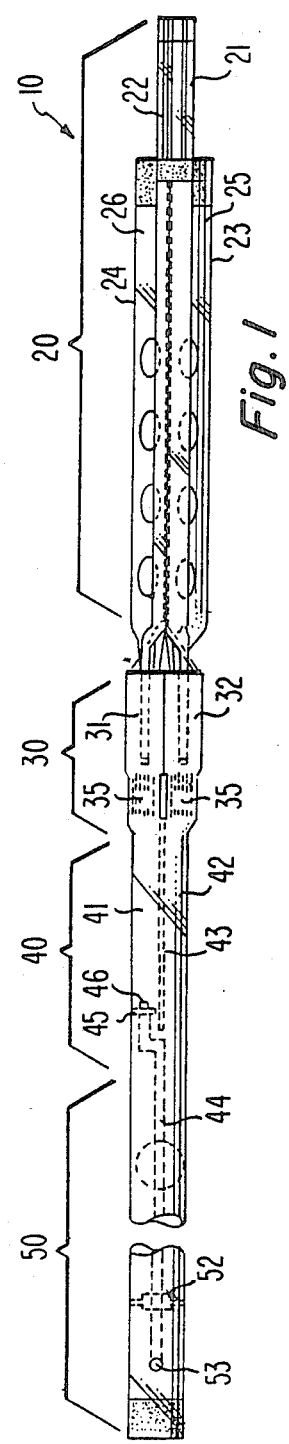
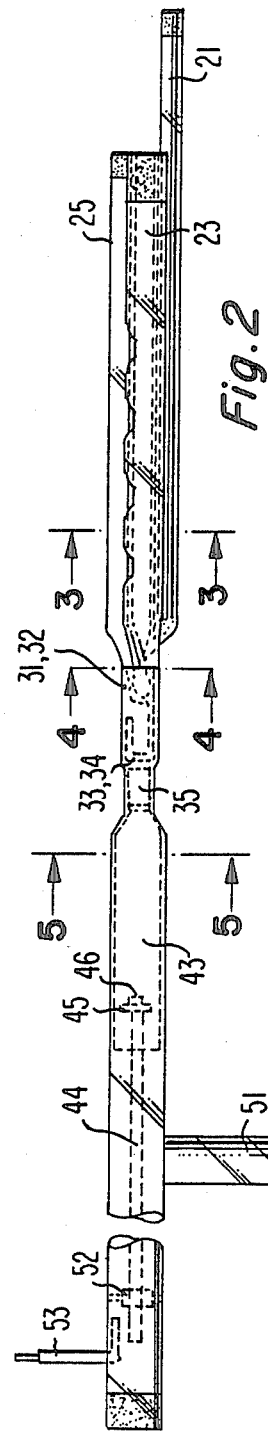
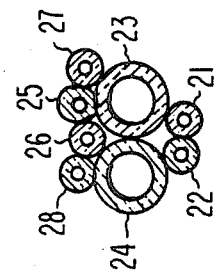
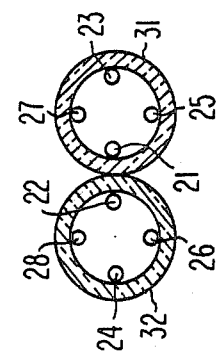
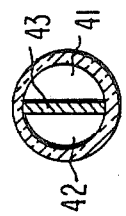

VAPOR PHASE GROWTH OF III-V MATERIALS

This invention pertains to the vapor phase growth of alloys of elements in Groups III and V of the Periodic Chart, and particularly to compositionally depth-uniform growth of such alloys.

BACKGROUND OF THE INVENTION

Photodetectors wherein the light absorptive layer is composed of an InGaAs alloy are finding increasing application in the optoelectronics industry. The growth of properly lattice-matched InGaAs ($In_{0.53}Ga_{0.47}As$) by vapor phase epitaxy requires precise control of variables such as reactive gas flow rates, carrier gas flow rates, temperatures of source metals, substrate temperature and the like. If a layer of an allou such as InGaAs is not properly lattice-matched to those layers underlying and overlying it in a device, there can be excessive dark currents in the alloy layer and, if the mismatch is severe, stress-induced cracking of the structure.

It has been observed that, heretofore, there has been a depth compositional gradient within a layer of a complex III-V alloy, particularly a ternary or quaternary alloy such as InGaAs, grown by conventional vapor phase epitaxy. As stated above, this compositional gradient, depending on its severity, can be disadvantageous to any device incorporating the layer. In accordance with this invention, a means of eliminating this depth compositional gradient is provided.

SUMMARY OF THE INVENTION

A uniform layer of a III-V alloy is grown by vapor phase epitaxy in a suitable apparatus. Coating of the walls of the deposition chamber of the apparatus with the desired alloy until there is no further evidence of a depth compositional gradient prior to insertion of the substrate therein produces a high quality, depth-uniform layer on the substrate. Roughening the inside surface of the deposition chamber of a suitable apparatus substantially enhances the coating thereof.

BRIEF DESCRIPTION OF THE DRAWING

FIG. 1 illustrates a top plan view of a representative apparatus which would be suitable for carrying out the process of the present invention.

FIG. 2 illustrates a side view of the apparatus illustrated in FIG. 1.

FIG. 3 is a cross-sectional view of the same apparatus along the line 3—3 in FIG. 2.

FIG. 4 is a cross-sectional view of the same apparatus along the line 4—4 in FIG. 2.

FIG. 5 is a cross-sectional view of the same apparatus along the line 5—5 in FIG. 2.

DETAILED DESCRIPTION OF THE PREFERRED EMBODIMENTS

FIG. 1 illustrates an apparatus representative of vapor phase epitaxial growth systems that could be utilized to carry out the process of this invention. Apparatus 10 comprises four major zones or sections; a gas feed zone 20, a gas mixing zone 30, a deposition zone 40 and an exhaust zone 50.

The gas feed zone 20 comprises a series of gas conduits which carry various semiconductor precursor and carrier gases to the gas mixing zone 30. The conduits are more clearly seen in FIGS. 2 and 3. The main gas conduits in FIG. 3 are designated as 23 and 24. The conduits 23 and 24 suitably carry the major components of a semiconductor layer, for example, elemental indium or gallium, binary sources such as gallium arsenide or indium phosphide, hydrides or halides, particularly the chlorides, of source elements, such as arsine, phosphine, arsenic trichloride and the like. Additional conduits 21, 22, 25, 26, 27 and 28 carry precursor substituents, dopants, carrier gases and the like. Although the conduits have been grouped together in the drawings, they do not have to be parallel or in the same plane to be connected to the gas mixing section 30 of the apparatus.

The gas mixing section 30 of the apparatus 10 incorporates additional features which are more clearly illustrated in FIGS. 2 and 4. FIG. 4 illustrates a combination of conduits 21, 23, 25 and 27 at the entrance to a mixing chamber 31. Conduits 22, 24, 26 and 28 are at the entrance to a mixing chamber 32. One of the gas conduits entering into each of the mixing chambers 31 and 32 is shaped in the form of a "U", 33 and 34. The purpose of the U-shaped conduits 33 and 34 is to introduce a semiconductor material or precursor counter-currently to the gas flow from the other conduits in each mixing chamber. This counter-current flow creates a turbulence in the mixing chambers 31 and 32 that more thoroughly mixes the reactants prior to deposition onto the substrate. In addition, the mixing chambers 31 and 32 contain baffles 35 which create additional turbulence and further enhance the mixing of the reactive gases before introduction into the deposition zone 40 of the apparatus.

As illustrated in FIGS. 1, 2 and 5, the deposition zone 40 of the apparatus 10 is divided into two deposition chambers 41 and 42 by a divider 43. Although the apparatus 10 is illustrated herein with two deposition chambers 41 and 42, each of which has it own gas feed and mixing zones, the deposition zone 40 can have any number of deposition chambers disposed about a central axis. A rod 44 extends into the reaction zone 40 to position a substrate holder 45 and a substrate 46 to receive a layer of the desired material. A driver/timer apparatus, not shown, connected to rod 44, automatically inserts and removes the substrate 46 from the deposition chambers. The term "deposition chamber" as utilized herein refers to that portion of the apparatus wherein a substrate is coated. It will be appreciated that, in an apparatus having a single deposition chamber, this term is synonymous with "deposition zone."

In operation, the substrate 46 is moved successively from one deposition chamber to the other by withdrawing the rod 44 beyond divider 43, rotating it and reinserting the substrate 46 into the other deposition chamber. It is beneficial that the pressure in deposition chambers 41 and 42 be substantially equal in order to minimize leakage of gases between the chambers. This can be ensured by regulation of the gas flows entering the deposition chambers 41 and 42.

The excess gases from the deposition chambers 41 and 42 flow into the exhaust zone 50 and are vented through the exhaust conduit 51. The exhaust section 50 also contains the rod 44 or other suitable rotatable means connected to the holder 45 for the substrate 46. The rod 44 is held in place by a guide 52. An additional source of phosphine or arsine as required to provide an atmosphere for preheating the substrate is available via conduit 53.

The apparatus shown in the FIGURES is representative of these which can be utilized to carry out the subject invention. It is to be understood that, although the subject invention will be discussed with regard to the apparatus illustrated, it is equally applicable to other apparatus having the capacity to form complex Group III-V alloys by vapor phase epitaxy such as, for example, that disclosed by Olsen et al. in U.S. Pat. No. 4,116,733, issued Sept. 26, 1978, the disclosure of which is incorporated herein by reference.

In conventional operation, suitable semiconductor vapor precursors are introduced through the gas feed section 20 of the apparatus which is gradually heated so that, when the vapor phase epitaxial growth media reach the gas mixing section 30 of the apparatus 10, the temperature is between about 500° and 900° C. The choice of temperature depends on the semiconductor vapor precursors used to form the desired layer. The growth of a layer of InGaAs in accordance with the subject process is suitably carried out at a temperature between about 630° and 700° C.

The substrate 46 is placed in the substrate holder 45 and inserted into the exhaust zone 50 where it is preheated in a suitable atmosphere, such as phosphine or arsine, to about the chosen deposition temperature prior to insertion into the deposition zone 40 and one of the deposition chambers 41 and 42. The configuration of the rod 44 allows the substrate holder 45 to be withdrawn from a deposition chamber beyond divider 43, rotated and reinserted into the other, or the next, deposition chamber to deposit successive layers of material on the substrate 46. These layers can be of the same semiconductor material of varying dopant compositions or layers of different semiconductor materials.

The frequency of rotation of the substrate 45 between deposition chambers is dependent on the material to be deposited in each chamber and the thickness of the desired coating, given known growth rates. The flow rates of the various vapor semiconductor precursors can be any established flow rates which are known in the art. Those skilled in the art will appreciate that flow rates may vary according to the configuration of the apparatus. Some experimentation is necessary with each apparatus in order to establish optimum conditions. Such manipulations are considered to be within the skill of the art.

In accordance with this invention, it has been found that the depth compositional gradient throughout a layer of a III-V alloy, such as InGaAs, is virtually eliminated by coating the walls of the deposition chamber of a vapor phase epitaxy system with the desired coating prior to introducing the substrate therein. Elimination of the depth compositional gradient in the desired layer substantially reduces the number of failures of devices incorporating such layers in proportion to the reduction in lattice mismatches among adjacent layers. Precoating of the deposition chamber surfaces with the desired composition also substantially eliminates outgassing of impurities such as silicon from the chamber walls. This further increases the quality of the desired layer.

It is necessary that the material being precoated on the walls of the deposition chamber be depth uniform and be of the same composition as the desired coating. Therefore, coating of the walls of the deposition chamber is carried out for a time sufficient so that depth uniform material is being deposited. This means that the coating of the walls is carried out until there is no longer a depth compositional gradient in the coating and several micrometers, suitably at least about ten, and preferably at least about twenty, micrometers of depth uniform material have been deposited on the walls. This does not mean that there may not be a compositional gradient along the axis of the deposition chamber. It means that, at a given circumference along the axis of the deposition chamber, the material being coated on the walls is compositionally uniform to a depth of at least several micrometers. As there is a compositional gradient in the coating along the axis of the deposition chamber, the statement that the coating must be of the same composition as that to be coated onto the substrate refers to that point in the chamber where the substrate will be located during deposition.

After the walls of the deposition chamber have been coated as described above, a substrate is inserted into the chamber and coated with a uniform coating of the the desired material with virtually no depth compositional gradient. It will be appreciated that, although coating of the entire deposition chamber is contemplated, it is necessary that a uniform coating be formed on at least that portion of the deposition chamber which is upstream in the flow of precursor materials from the position of the substrate.

Those of ordinary skill in the art appreciate that substrates may be coated in a vapor phase epitaxy apparatus until traps placed in the exhaust system to catch effluents become clogged. The system must then be shut down and cleaned. Precoating of the deposition chamber in accordance with this invention will produce uniform, depth gradient-free coatings until the system must be shut down for cleaning. The additional coating deposited on the walls of the deposition chamber during substrate coating is not considered significant. It is, of course, necessary that the deposition chamber be recoated after the system has been shut down and cleaned, or if it is desired to change the composition of the coating being deposited.

Further in accordance with this invention, it has been found that roughening the walls of the deposition chamber significantly reduces the time required to coat them from about twelve hours down to an hour or two. This represents a substantial improvement in the process since there is only so much operational time for the coating of substrates before the apparatus must be stopped and cleaned. Roughening of the walls of the deposition chamber typically increases the operating time by about ten hours. Another advantage of roughening the walls of the deposition chamber is that it provides effective control over the area to be coated. This provides even greater control over the uniformity of the coating on the substrate in that it assures adequate coating of the critical deposition chamber area upstream from the substrate. The walls of the chambers of deposition zone 40 are suitably uniformly roughened by conventional means, such as by sand blasting or chemical etching, thereby providing nucleation sites from which a uniform coating may be readily grown. It is not necessary that the growth sites be in a pattern, only that they be sufficiently close together so that growth of the coating will be more rapid.

The process of this invention improves the growth of Group III-V alloys regardless of whether the apparatus utilized is a single- or multi-chamber device. In the latter, each deposition chamber is precoated with the desired coating composition. The subject process likewise improves the efficiency of the coating process and significantly improves the yield of devices formed thereby, in some instances by eighty percent or more.

The invention has been described with reference to preferred embodiments thereof. It will be appreciated by those skilled in the art that various modifications may be made from the specific details given without departing from the spirit and scope of the invention.

I claim:

1. In a process of forming a layer of a ternary or quarternary III-V semiconductor alloy uniformly on a substrate by vapor phase epitaxy in a suitable apparatus, the improvement wherein, prior to introducing the substrate into the deposition chamber of said apparatus, the walls of the deposition chamber are roughened and a coating of material is formed on said walls to a thickness such that the material being deposited on the walls is depth uniform in composition and of the same composition as said layer, then introducing said substrate into said apparatus and coating it with a uniform coating of said material with virtually no depth compositional gradient.

2. An improved process in accordance with claim 1, wherein at least about ten micrometers of compositionally uniform material are formed on the walls of the deposition chamber prior to introduction of the substrate therein.

3. An improved process in accordance with claim 2, wherein at least about twenty micrometers of compositionally uniform material are formed on the walls of the deposition chamber prior to introduction of the substrate therein.

4. An improved process in accordance with claim 1, wherein the material is an indium gallium arsenide alloy.

* * * * *